United States Patent
Takeshige et al.

(10) Patent No.: US 7,013,414 B2
(45) Date of Patent: Mar. 14, 2006

(54) TEST METHOD AND TEST SYSTEM FOR SEMICONDUCTOR DEVICE

(75) Inventors: Masayuki Takeshige, Kasugai (JP); Sumitaka Hibino, Kasugai (JP); Kenji Yamada, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 498 days.

(21) Appl. No.: 10/026,560

(22) Filed: Dec. 27, 2001

(65) Prior Publication Data

US 2002/0188900 A1    Dec. 12, 2002

(30) Foreign Application Priority Data

Jun. 8, 2001    (JP)    ............... 2001-174101

(51) Int. Cl.
  *G11C 29/00*    (2006.01)
(52) U.S. Cl. .................................. 714/719; 365/201
(58) Field of Classification Search ........ 714/718–719; 365/201
See application file for complete search history.

(56) References Cited

U.S. PATENT DOCUMENTS 5,539,699 A * 7/1996 Sato et al. ............... 365/201
5,793,774 A * 8/1998 Usui et al. ............... 714/719
6,480,979 B1 * 11/2002 Tomari ...................... 714/724
6,546,511 B1 * 4/2003 Sim et al. .................. 714/724
6,550,023 B1 * 4/2003 Brauch et al. ............. 714/42

OTHER PUBLICATIONS

"Processor-Programmable Memory BIST for Bus-connected Embedded Memories" Tsai et al. Design Automation Conference Proceedings, 2001. Publication Date: Jan. 30-Feb. 2 2001 pp. 325-330 Inspec Accession No.: 6924510.*

* cited by examiner

*Primary Examiner*—Guy Lamarre
*Assistant Examiner*—Cynthia Britt
(74) *Attorney, Agent, or Firm*—Arent Fox PLLC (57) ABSTRACT

Method and system for shortening the time needed to test a semiconductor device having a plurality of memory circuits. The semiconductor device includes an address decoder for selecting a plurality of memory circuits and causing the memory circuits to perform a read/write operation. A comparator receives plural pieces of read data read from the plurality of memory circuits and compares the plural pieces of read data with one another. A processing unit compares one of the plural pieces of read data with write data. Using the comparison results of the comparator and the processing unit shorten the time needed to test the plurality of memory circuits.

18 Claims, 10 Drawing Sheets

| Upper Address Decode Signal | A15 | A14 | TEST | SEL3 | SEL2 | SEL1 | SEL0 |
|---|---|---|---|---|---|---|---|
| 1 | 0 | 0 | 0 | 0 | 0 | 0 | 1 |
| 1 | 0 | 1 | 0 | 0 | 0 | 1 | 0 |
| 1 | 1 | 0 | 0 | 0 | 1 | 0 | 0 |
| 1 | 1 | 1 | 0 | 1 | 0 | 0 | 0 |
| 1 | 0 | 0 | 1 | 0 | 0 | 0 | 1 |
| 1 | 0 | 1 | 1 | 0 | 0 | 1 | 0 |
| 1 | 1 | 0 | 1 | 0 | 1 | 0 | 0 |
| 1 | 1 | 1 | 1 | 1 | 1 | 1 | 1 |
| 0 | X | X | X | 0 | 0 | 0 | 0 |

| Upper Address Decode Signal | A15 | A14 | TEST | SEL3 | SEL2 | SEL1 | SEL0 |
|---|---|---|---|---|---|---|---|
| 1 | 0 | 0 | 0 | 0 | 0 | 0 | 1 |
| 1 | 0 | 1 | 0 | 0 | 0 | 1 | 0 |
| 1 | 1 | 0 | 0 | 0 | 1 | 0 | 0 |
| 1 | 1 | 1 | 0 | 1 | 0 | 0 | 0 |
| 1 | X | X | 1 | 1 | 1 | 1 | 1 |
| 0 | X | X | X | 0 | 0 | 0 | 0 |

| Upper Address Decode Signal | A15 | A14 | TEST | SEL3 | SEL2 | SEL1 | SEL0 |
|---|---|---|---|---|---|---|---|
| 1 | 0 | 0 | 0 | 0 | 0 | 0 | 1 |
| 1 | 0 | 1 | 0 | 0 | 0 | 1 | 0 |
| 1 | 1 | 0 | 0 | 0 | 1 | 0 | 0 |
| 1 | 1 | 1 | 0 | 1 | 0 | 0 | 0 |
| 1 | X | X | 1 | 1 | 1 | 1 | 1 |
| 0 | X | X | X | 0 | 0 | 0 | 0 |

TEST METHOD AND TEST SYSTEM FOR SEMICONDUCTOR DEVICE

BACKGROUND OF THE INVENTION

The present invention relates generally to a semiconductor device, and, more particularly, to a test method and test system for a plurality of memory circuits in a semiconductor device.

Recently, some semiconductor devices (LSIs) have a processing circuit (CPU) and a plurality of memory circuits, which are formed on a single semiconductor substrate. LSIs are tested before shipment. Increasing the scale of LSIs lengthens the time for the operational test, resulting in an increase in production cost. To avoid such increase in production cost, therefore, the testing time should be shortened.

There are three conventional methods known in the industry for conducting an operational test on each of a plurality of memory circuits.

(First method) A testing apparatus selects and tests individual memory circuits one after another.

(Second method) The individual memory circuits are accessed via a plurality of external terminals, and a testing apparatus conducts a test by directly accessing a plurality of memory circuits via the plurality of external terminals and simultaneously performing a write/read operation on all of the memory circuits.

(Third method) A test is conducted by comparing read data from all of the memory circuits with one another in an LSI, outputting signals indicating whether read data from all of the memory circuits match with one another from output terminals, and comparing the output signals with one another.

These conventional methods have the following drawbacks:

In the first method, since the individual memory circuits are tested serially one after another, the testing time becomes longer as the number and capacity of memories in a single LSI become large. Thus, as the scale of LSIs increases, unavoidably, so does the production cost.

Because the second method performs an operational test on a plurality of memory circuits simultaneously, the testing time is shortened. The tradeoff is that the number of external terminals of the LSI increases. To prevent the number of external terminals from increasing, the external terminals may selectively be operated between a test mode and a normal operation mode. In this case, however, the number of output signals in the test mode increases, thus complicating the switching the functions of the terminals. Furthermore, in cases where the number of external terminals of an LSI cannot be increased, the number of memory circuits that can simultaneously be subjected to a test is also limited.

The third method uses fewer output terminals than the second method. According to the third method, however, in cases where all of the output signals of a plurality of memory circuits have the same value but in error, the error cannot be detected. The fewer the memory circuits that simultaneously output read data is (e.g., when two memory circuits simultaneously output read data), the higher the ratio of occurrence of such errors becomes.

What is more, since the first and second methods access each memory circuit in an LSI via an associated external terminal, a testing apparatus having a relatively slow operational speed may not be able to shorten the testing time so much. Similarly, the third method outputs a test result according to the operational speed of an LSI. In cases where the operational speed of the testing apparatus is slower than that of the LSI, the testing apparatus cannot receive all of the test results. In other words, a test cannot be conducted at the operational speed of the LSI.

SUMMARY OF THE INVENTION

Accordingly, it is an object of the invention to provide a test method and test system for a semiconductor device, which shorten the time needed to test a plurality of memory circuits.

In a first aspect of the present invention, a method of testing a plurality of memory circuits included in a semiconductor device is provided. The method includes selecting the plurality of memory circuits and causing the memory circuits to perform a read/write operation, comparing plural pieces of read data read from the plurality of memory circuits in a read operation with one another, and comparing one of the plural pieces of read data with write data.

In a second aspect of the present invention, a semiconductor device includes a plurality of memory circuits, each of which performs data writing and data reading, a processing unit coupled to the plurality of memory circuits for accessing one of the plurality of memory circuits for data writing and data reading, an address decoder coupled to the processing unit for receiving the address signal and generating a plurality of select signals for selecting the plurality of memory circuits in a test mode, wherein the plurality of memory circuits perform data writing and data reading in accordance with the plurality of select signals, a multiplexer coupled to the plurality of memory circuits and the processing unit for supplying the processing unit with read data read from one memory circuit which is accessed by the processing unit, and a comparator coupled to the plurality of memory circuits for comparing plural pieces of read data respectively read from the plurality of memory circuits with one another in the test mode. In the test mode, the processing unit compares data written in the plurality of memory circuits with the read data from the multiplexer to determine whether the write data coincides with the read data.

In a third aspect of the present invention, a system for testing a plurality of memory circuits included in a semiconductor device is provided. The system includes an address decoder for selecting the plurality of memory circuits and causing the memory circuits to perform a read/write operation, a comparator for receiving plural pieces of read data read from the plurality of memory circuits and comparing the plural pieces of read data with one another, and a processing unit for comparing one of the plural pieces of read data with write data.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood with reference to the following description of the presently preferred embodiments together with the accompanying drawings in which.

DETAILED DESCRIPTION OF THE PREFERRED EMBODIMENTS

In the drawings, like numerals are used for like elements throughout.

Figure 1:
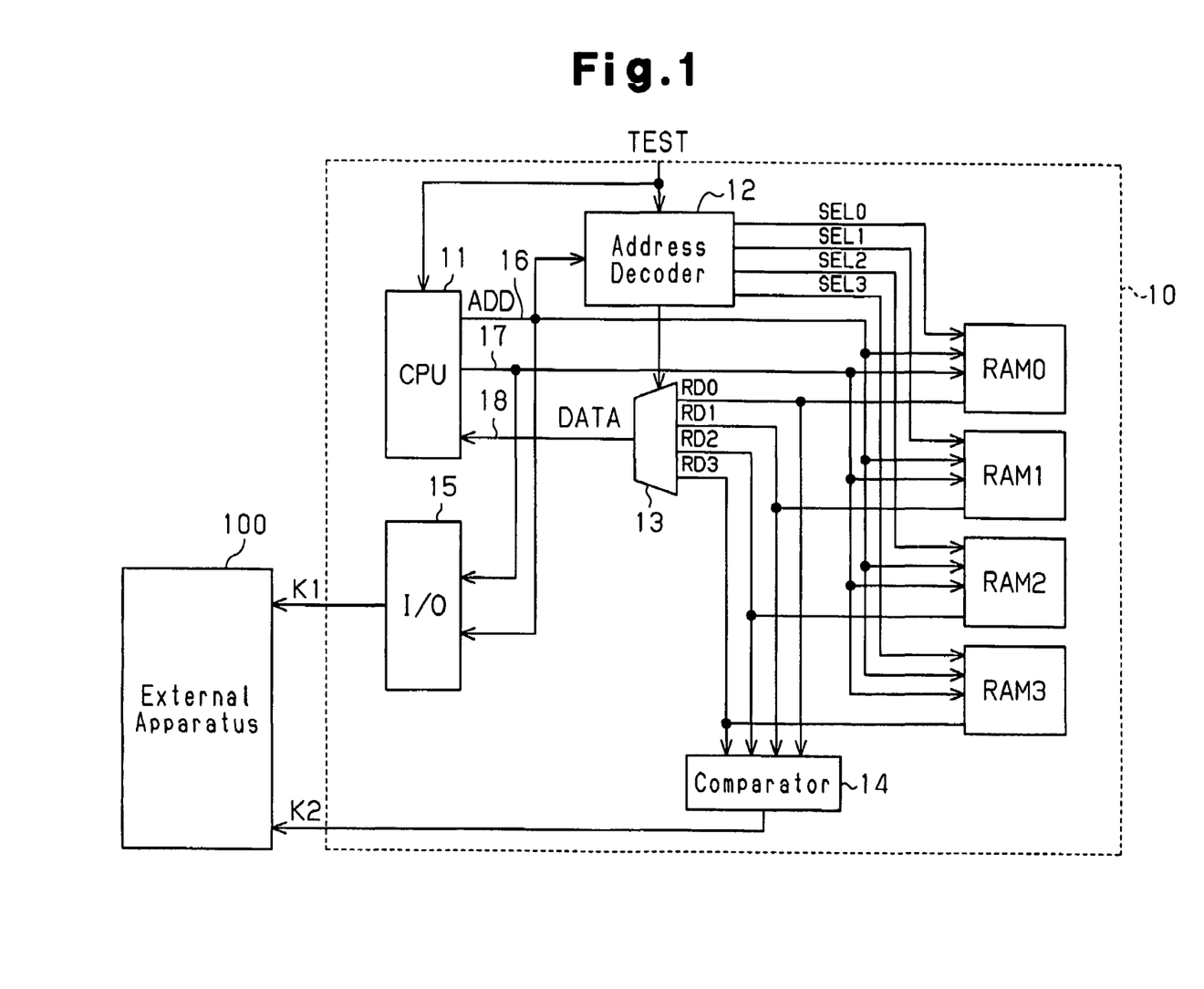
FIG. 1 is a schematic block diagram of a semiconductor device according to a first embodiment of the present invention.

FIG. 1 is a schematic block diagram of a semiconductor device 10 according to one embodiment of the present invention. FIG. 1 shows a portion of the semiconductor device 10 associated with a memory test.

The semiconductor device 10 includes plural (four in FIG. 1) memory circuits RAM0 to RAM3, a central processing unit (CPU) 11, an address decoder 12, a multiplexer 13, a comparator 14 and an input/output circuit 15.

The CPU 11 is coupled to individual memory circuits RAM0 to RAM3 by an address bus 16 and a write-data and control bus 17. Each of the address bus 16 and the write-data and control bus 17 comprises a plurality of signal lines.

The address decoder 12, which is coupled to the address bus 16, receives an address signal ADD from the CPU 11 via the address bus 16. The address decoder 12 also receives a test mode signal TEST from an external apparatus (testing apparatus, not shown).

The address decoder 12 determines whether the present mode is a normal mode or a test mode in accordance with the test mode signal TEST. The address decoder 12 decodes the address signal ADD to generate first to fourth select signals SEL0 to SEL3 for selecting one of the first to fourth memory circuits RAM0 to RAM3 according to the determined mode.

In the normal mode, the address decoder 12 generates the select signals SEL0 to SEL3 for selecting one of the memory circuits RAM0 to RAM3 accessed by the CPU 11 based on the address signal ADD. In FIG. 1, the address signal ADD consists of address signals A0 to A15 of 16 bits in total, and one of the first to fourth memory circuits RAM0 to RAM3 is selected by the address signals A15 and A14 of upper two bits. The address decoder 12 decodes the upper-2-bit address signals A15 and A14 to generate the first to fourth select signals SEL0 to SEL3. Note that the number of bits of the address signal ADD may be changed as needed.

When the CPU 11 accesses the first memory circuit RAM0, the address decoder 12 decodes the address signals A15 and A14 to make active the first select signal SEL0 corresponding to the first memory circuit RAM0 (e.g., to set the first select signal SEL0 to an H (High) level). In response to the active first select signal SEL0, the first memory circuit RAM0 performs an access to the CPU 11.

In the test mode, when the CPU 11 accesses one of the first to fourth memory circuits RAM0 to RAM3, the address decoder 12 generates the first to fourth select signals SEL0 to SEL3 so that all of the memory circuits RAM0 to RAM3 are selected simultaneously.

In the present embodiment, program data (which is pre-stored in an unillustrated ROM or non-volatile RAM) for testing the individual memory circuits RAM0 to RAM3 is set to access the fourth memory circuit RAM3 in a memory test. In making the fourth select signal SEL3 corresponding to the fourth memory circuit RAM4 active in the test mode, the address decoder 12 also simultaneously makes active the first to third select signals SEL0 to SEL2 for selecting the first to third memory circuits RAM0 to RAM2. When the CPU 11 accesses one of the first to third memory circuits RAM0 to RAM2 in the test mode, the address decoder 12 makes active only a single select signal corresponding to the memory circuit to be accessed.

The first memory circuit RAM0 then performs a write operation or a read operation in response to the active first select signal SEL0 and in accordance with a control signal supplied via the control bus 17. In the write operation, the first memory circuit RAM0 stores write data, which is supplied via the write-data bus, in a memory area (one or plural memory cells) that is selected by the address signal ADD supplied via the address bus 16. In the read operation, the first memory circuit RAM0 outputs data read from the memory area selected by the address signal ADD.

Likewise, each of the second to fourth memory circuits RAM1 to RAM 3 stores write data or outputs read data in response to the associated active second to fourth select signals SEL1 and SEL3, respectively, in accordance with the control signal.

In the normal mode, one of the first to fourth select signals SEL0 to SEL3, which corresponds to the address signal ADD for the memory circuit and which is to be accessed by the CPU 11, becomes active. As such, one of the first to fourth memory circuits RAM0 to RAM3 is selected by the CPU 11 to perform a read operation or a write operation.

In the test mode, when the CPU 11 accesses a predetermined memory circuit (fourth memory circuit RAM3), all of the first to fourth select signals SEL0 to SEL3 are made active. Accordingly, the first to fourth memory circuits RAM0 to RAM3 simultaneously perform a read operation or a write operation. That is, in the test mode, the CPU 11 simultaneously accesses all of the memory circuits RAM0 to RAM3 when the fourth memory circuit RAM3 is selected. This shortens the time needed for the read and write operations to about a quarter (¼) of the time needed when the memory circuits RAM0 to RAM3 are sequentially selected and tested one after another.

The multiplexer 13 and the comparator 14 receive read data RD0 to RD3 output from the memory circuits RAM0 to RAM3. The multiplexer 13 supplies one of the read data RD0 to RD3 to the CPU 11 via a read-data bus 18 in accordance with the test mode signal TEST and the first to fourth select signals SEL0 to SEL3.

Specifically, when the test mode signal TEST indicates the normal mode, the multiplexer 13 outputs one of the first to fourth read data RD0 to RD3 that corresponds to the active one of the first to fourth select signals SEL0 to SEL3. For example, when the first select signal SEL0 is active, the multiplexer 13 outputs the first read data RD0 corresponding to the first select signal SEL0. The first select signal SEL0 is made active at the time the CPU 11 accesses the first memory circuit RAM0. Therefore, the CPU 11 either writes data in the first memory circuit RAM0 in response to the first select signal SEL0 or reads the data RD0 from the first memory circuit RAM0.

When the test mode signal TEST indicates the test mode, the multiplexer 13 accordingly outputs predetermined read data (fourth read data RD3 in the present embodiment) in the first to fourth read data RD0 to RD3. In the test mode, the CPU 11 receives the fourth read data RD3 and compares the fourth read data RD3 with write data that has been written previously in the fourth memory circuit RAM3. Based on the comparison result, the CPU 11 checks if the write data written in the fourth memory circuit RAM3 has been read accurately, and supplies a confirmation signal K1 indicating the comparison result to an external apparatus 100 via the input/output circuit 15.

The comparator 14 receives the first to fourth read data RD0 to RD3, compares the first to fourth read data RD0 to RD3 with one another and supplies the external apparatus (testing apparatus) 100 with a decision signal K2 indicating if all of the read data RD0 to RD3 match with one another.

Based on the confirmation signal K1 and the decision signal K2, the testing apparatus determines whether the first to fourth memory circuits RAM0 to RAM3 are operating normally. The confirmation signal K1 indicates if write data to the fourth memory circuit RAM3 coincides with the read data RD3. The decision signal K2 indicates if the first to fourth read data RD0 to RD3 coincide with one another. The first to third memory circuits RAM0 to RAM2 are selected at the same time as the fourth memory circuit RAM3 and store write data to be written in the fourth memory circuit RAM3. It is therefore possible to determine based on the confirmation signal K1 and the decision signal K2 if all of the first to fourth read data RD0 to RD3, which are read from the first to fourth memory circuits RAM0 to RAM3, coincide with the write data.

In the test mode, a read operation and a write operation are simultaneously performed with respect to the first to fourth memory circuits RAM0 to RAM3. As a result, the time needed for the read and write operations is shorter than the total time needed to perform the read and write operations for each of the memory circuits RAM0 to RAM3. Since it is possible to determine whether the first to fourth memory circuits RAM0 to RAM3 are good using only the confirmation signal K1 and the decision signal K2, the number of external terminals does not have to be increased.

Furthermore, since the CPU 11 compares the write data with the read data RD3, even if all of the read data RD0 to RD3 from the first to fourth memory circuits RAM0 to RAM3 are in error, the testing apparatus reliably detects the error and does not make a misjudgment.

Figure 2:
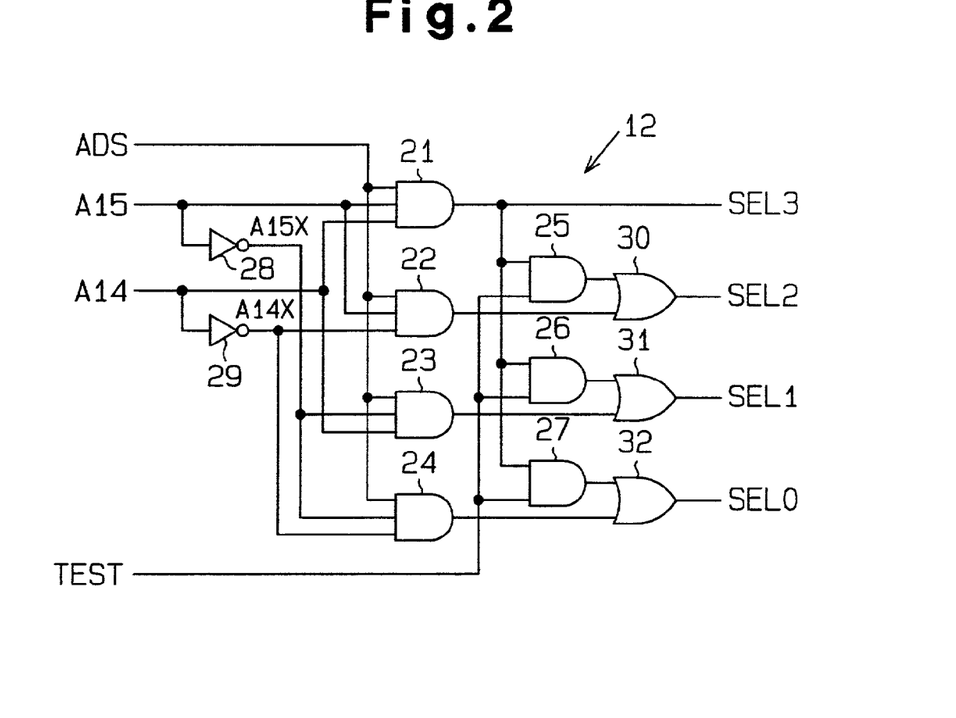
FIG. 2 is a schematic circuit diagram of an address decoder of the semiconductor device of FIG. 1.
Figure 3:
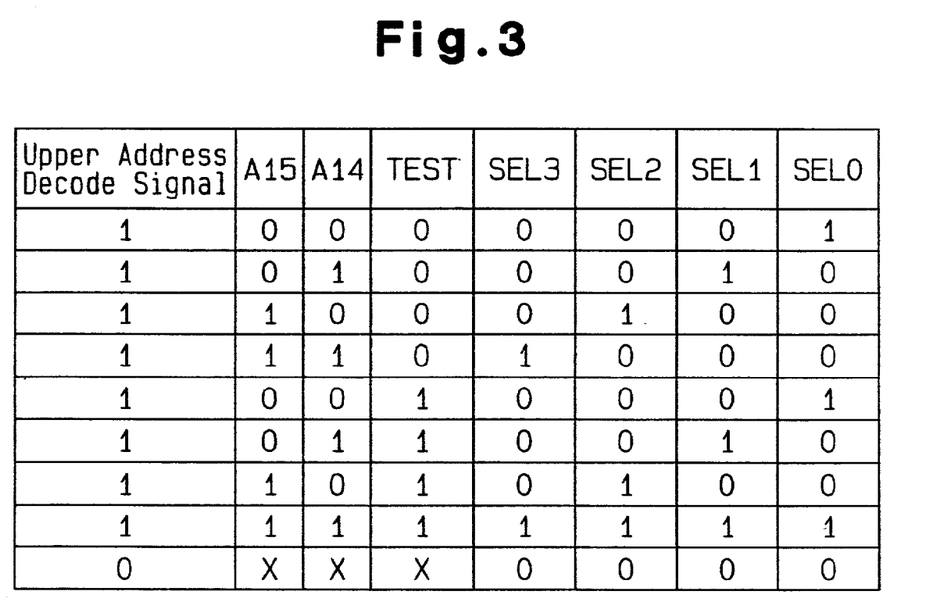
FIG. 3 is an explanatory diagram for the operation of the address decoder of FIG. 2.

FIG. 2 is a schematic circuit diagram of the address decoder 12 and FIG. 3 is an explanatory diagram for the operation of the address decoder 12. In FIG. 2, the address decoder 12 includes AND gates 21 to 27, inverter circuits 28 and 29 and OR gates 30 to 32. The address decoder 12 is supplied with an upper address decode signal ADS, the upper-2-bit address signals A15 and A14 and the test mode signal TEST.

The upper-2-bit address signals A15 and A14 are respectively supplied to the inverter circuits 28 and 29. The inverter circuit 28 inverts the logic level of the address signal A15 of the most significant bit to produce an inverted address signal A15X. The inverter circuit 29 inverts the logic level of the address signal A14 of the second highest bit to produce an inverted address signal A14X.

Each of the first to fourth AND gates 21 to 24 have three input terminals, one of which being where the upper address decode signal ADS is received.

The first AND gate 21 additionally receives the address signals A15 and A14 and generates the fourth select signal SEL3. The fifth to seventh AND gates 25 to 27 receive the fourth select signal SEL3 and the test mode signal TEST and produces an AND signal thereof.

The second AND gate 22 receives the address signal A15 and the inverted address signal A14X and provides an AND signal of the signals ADS, A15 and A14X to the OR gate 30. The OR gate 30 performs an OR operation on the output signal of the fifth AND gate 25 and the output signal of the second AND gate 22 to generate the third select signal SEL2.

The third AND gate 23 receives the inverted address signal A15X and the address signal A14 and provides an AND signal of the signals ADS, A15X and A14 to the OR gate 31. The OR gate 31 performs an OR operation on the output signal of the sixth AND gate 26 and the output signal of the third AND gate 23 to generate the second select signal SEL1.

The fourth AND gate 24 receives the inverted address signal A15X and the inverted address signal A14X and provides an AND signal of the signals ADS, A15X and A14X to the OR gate 32. The OR gate 32 performs an OR operation on the output signal of the seventh AND gate 27 and the output signal of the fourth AND gate 24 to generate the first select signal SEL0.

As shown in FIG. 3, in the normal mode (i.e., the test mode signal TEST=0), the address decoder 12 decodes the upper-2-bit address signals A15 and A14 to generate the first to fourth select signals SEL0 to SEL3 in response to the upper address decode signal ADS of an H-level (1). In the test mode (i.e., the test mode signal TEST=1), when the CPU 11 accesses the fourth memory circuit RAM3 (i.e., when the upper address decode signal ADS has an H-level), the address decoder 12 generates the first to fourth select signals SEL0 to SEL3 having the H-level.

In response to the upper address decode signal ADS having an L-level (0), the address decoder 12 generates the first to fourth select signals SEL0 to SEL3 having the L-level, regardless of the mode.

When the CPU 11 selects one of the memory circuits RAM0 to RAM3, the address decoder 12 may raise all of the select signals SEL0 to SEL3 to the H-level.

Figure 4:
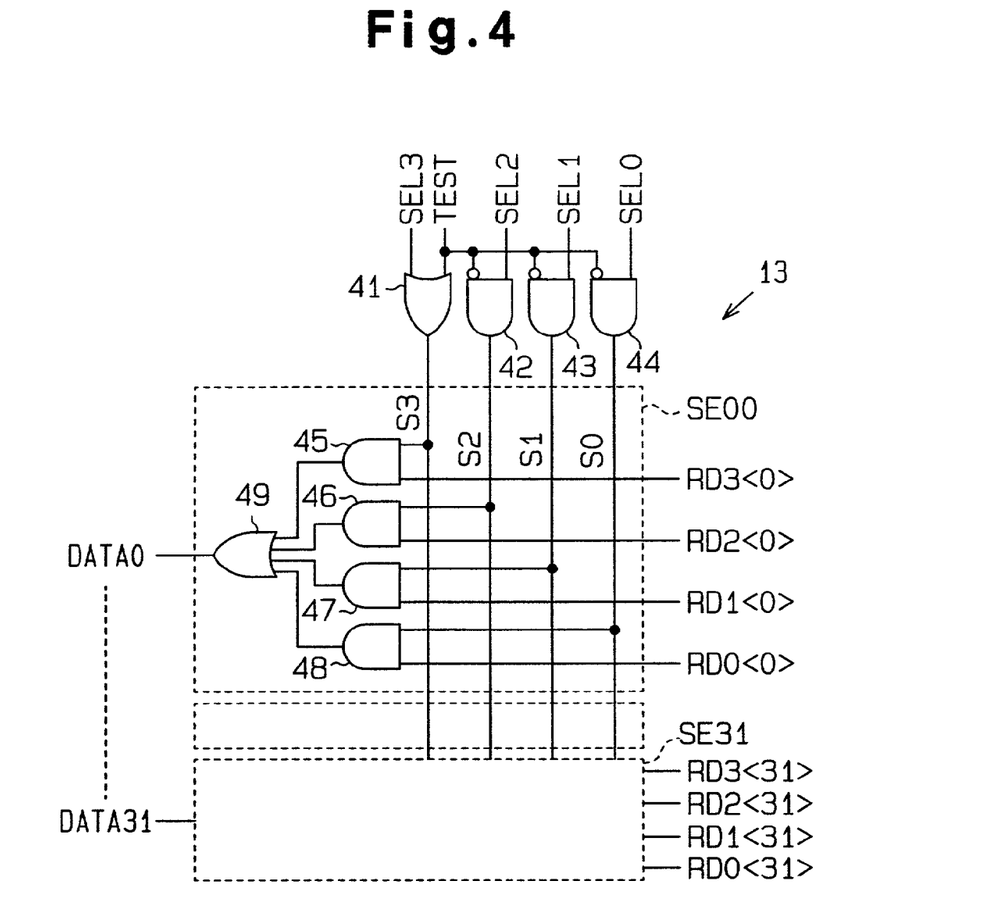
FIG. 4 is a schematic circuit diagram of a multiplexer of the semiconductor device of FIG. 1.

FIG. 4 is a schematic circuit diagram of the multiplexer 13. As shown in FIG. 4, the multiplexer 13 includes plural (32 in the present embodiment) selection circuits SE00 to SE31 corresponding to the number of bits of the read data RD0 to RD3, an OR gate 41 and AND gates 42 to 44. Each bit of each of the read data RD0 to RD3 is expressed by affixing its bit number. For example, the least significant bit (0th bit) of the first read data RD0 is expressed by RD0<0> and the most significant bit (31st bit) of the first read data RD0 is expressed by RD0<31>.

The OR gate 41 receives the fourth select signal SEL3 and the test mode signal TEST. In the normal mode where the test mode signal TEST has an L-level, the OR gate 41 produces a logical signal S3 identical to the fourth select signal SEL3. In the test mode where the test mode signal TEST has an H-level, the OR gate 41 produces the logical signal S3 having an H-level.

The AND gates 42 to 44 invert the test mode signal TEST and respectively receive the third to first select signals SEL2 to SEL0, produce logical signals S2 to S0 that are respectively identical to the third to first select signals SEL2 to SEL0 in the normal mode and produce the logical signals S2 to S0 having L-levels in the test mode.

The signals S3 to S0 are supplied to all of the selection circuits SE00 to SE31. The first selection circuit SE00 includes AND gates 45 to 48 and an OR gate 49. In the normal mode, the fourth AND gate 45 receives the signal S3 from the OR gate 41 and the least significant bit RD3<0> of the fourth read data RD3 and outputs read data RD3<0> in response to the H-level signal S3 (fourth select signal SEL3). The fourth AND gate 45 outputs read data RD3<0> in the test mode.

The third AND gate 46 receives the output signal S2 of the AND gate 42 and the third read data RD2<0> and outputs read data RD2<0> in the normal mode in response to the H-level signal S2 (third select signal SEL2). The third AND gate 46 outputs an L-level signal in the test mode.

The second AND gate 47 receives the output signal S1 of the AND gate 43 and the second read data RD1<0> and outputs read data RD1<0> in the normal mode in response to the H-level signal S1 (second select signal SELL). The second AND gate 47 outputs an L-level signal in the test mode.

The first AND gate 48 receives the output signal S0 of the AND gate 44 and the first read data RD0<0> and outputs read data RD0<0> in the normal mode in response to the H-level signal S0 (first select signal SEL0). The first AND gate 48 outputs an L-level signal in the test mode.

The OR gate 49 performs an OR operation on the output signals of the first to fourth AND gates 45 to 48 and outputs a data signal DATA0.

The first selection circuit SE00 produces first to fourth read data RD0<0> to RD3<0> that respectively correspond to the first to fourth select signals SEL0 to SEL3 in the normal mode and produces the fourth read data RD3<0> in the test mode. The second to thirty-second selection circuits SE01 to SE31 operate in the same way as the first selection circuit SE00 does.

Accordingly, the multiplexer 13 outputs data signals DATA0 to DATA31 each having a bit level of one of the first to fourth read data RD0 to RD3 that correspond to the first to fourth select signals SEL0 to SEL3 in the normal mode, and outputs the data signals DATA0 to DATA31 each having the bit level of the fourth read data RD3 in the test mode.

Figure 5:
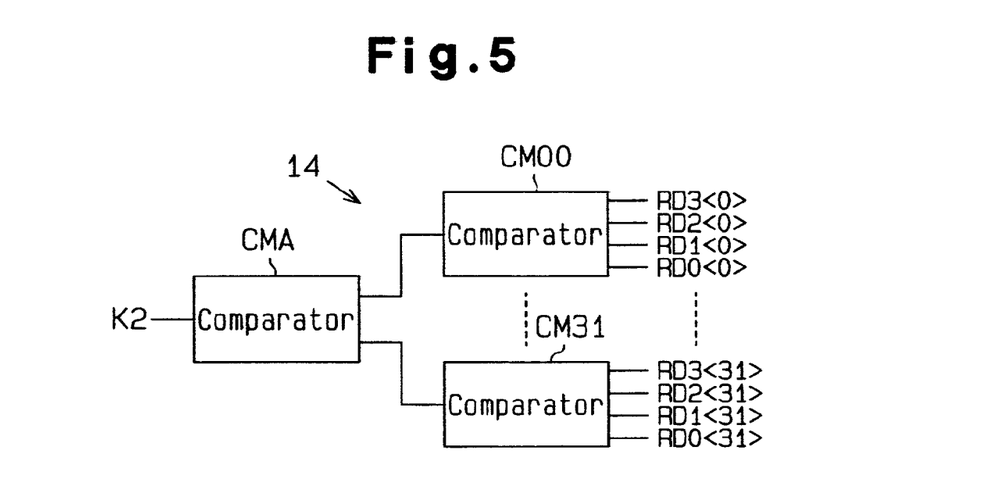
FIG. 5 is a schematic circuit diagram of a comparator of the semiconductor device of FIG. 1.

FIG. 5 is a schematic circuit diagram of the comparator 14. In FIG. 5, the comparator 14 includes plural (32 in the present embodiment) first-stage comparison circuits CM00 to CM31 that correspond in number to the bits of each of the read data RD0 to RD3 output from the memory circuits RAM0 to RAM3 and a second-stage comparison circuit CMA coupled to each of the first-stage comparison circuits CM00 to CM31.

Each of the first-stage comparison circuits CM00 to CM31 receives associated bits of the first to fourth read data RD0 to RD3. For example, the first comparison circuit CM00 receives 0th-bit read data RD3<0>, RD2<0>, RD1<0> and RD0<0>, and generates a signal indicating if the read data RD3<0> to RD0<0> match with one another by comparing the read data RD3<0> to RD0<0> with one another. The thirty-second comparison circuit CM31 receives 31st-bit read data RD3<31>, RD2<31>, RD1<31> and RD0<31>, and generates a signal indicating if the read data RD3<31> to RD0<31>match with one another by comparing the read data RD3<31> to RD0<31> with one another. The second-stage comparison circuit CMA compares the output signals of the first-stage comparison circuits CM00 to CM31 with one another and generates a signal K2 indicating whether those output signals match with one another.

The semiconductor device 10 according to the present invention has the following advantages.

In the test mode, in accordance with the address signal ADD received from the CPU 11 for accessing a particular memory circuit, the address decoder 12 generates plural select signals SEL0 to SEL3 such that the first to fourth memory circuits RAM0 to RAM3 are selected simultaneously. The multiplexer 13 supplies the CPU 11 with read data from the memory circuit that is to be accessed by the CPU 11. The CPU 11 checks whether the write data match with the read data and generates a confirmation signal K1. The comparator 14 compares the read data RD0 to RD3 that are respectively read from the first to fourth memory circuits RAM0 to RAM3 with one another and generates a decision signal K2. Accordingly, decision errors are reduced based on the results of comparing the write data with the read data and the results of comparing the read data RD0 to RD3 with one another. Further, since the first to fourth memory circuits RAM0 to RAM3 are simultaneously selected, the time needed to access the memory circuits becomes shorter, thus reducing the testing time.

It should be apparent to those skilled in the art that the present invention may be embodied in many other forms without departing from the spirit or scope of the present invention. Particularly, it should be understood that the present invention may be embodied in the following forms.

Figure 6:
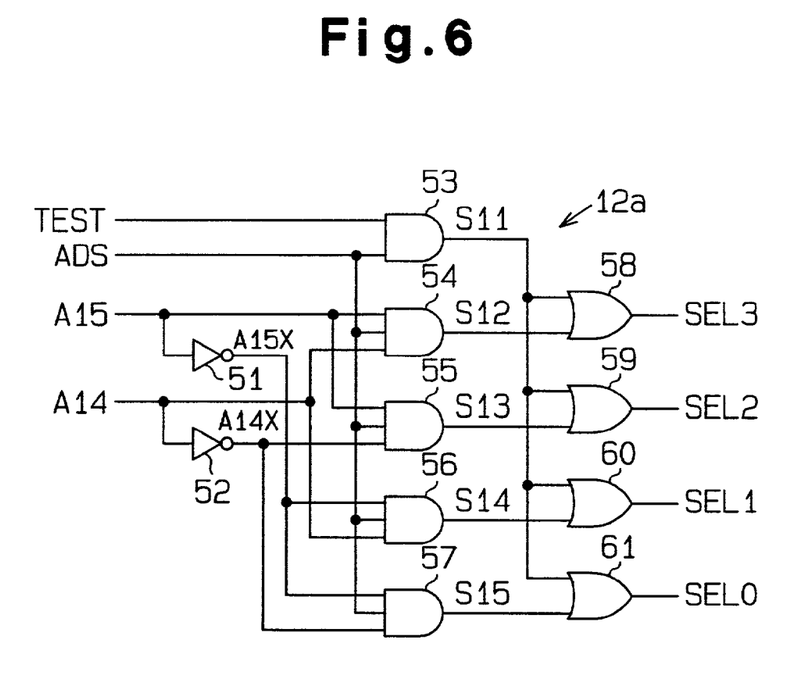
FIG. 6 is a schematic circuit diagram of an address decoder according to a first modification.
Figure 7:
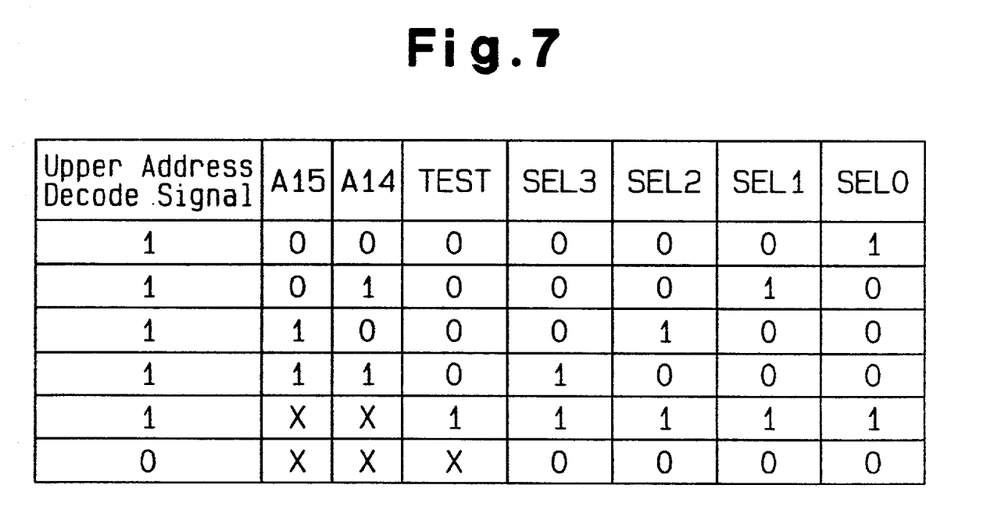
FIG. 7 is an explanatory diagram for the operation of the address decoder of FIG. 6.

(1) An address decoder 12a in FIG. 6 may be used in place of the address decoder 12. FIG. 7 is an explanatory diagram for the operation of the address decoder 12a. The address decoder 12a includes inverter circuits 51 and 52, AND gates 53 to 57 and OR gates 58 to 61.

The address decoder 12a is supplied with the upper address decode signal ADS, the upper-2-bit address signals A15 and A14 and the test mode signal TEST.

The upper-2-bit address signals A15 and A14 are respectively supplied to the inverter circuits 51 and 52. The inverter circuit 51 inverts the address signal A15 of the most significant bit, thus generating the inverted address signal A15X. The inverter circuit 52 inverts the logic level of the address signal A14 of the second highest bit to produce the inverted address signal A14X.

The first AND gate 53 has two input terminals and each of the second to fifth AND gates 54 to 57 has three input terminals.

The first AND gate 53 supplies an AND signal S11 of the upper address decode signal ADS and the test mode signal TEST to the OR gates 58 to 61. That is, the first AND gate 53 generates the L-level signal S11 in the normal mode and generates the H-level signal S11 in the test mode.

The second AND gate 54 receives the address signals A15 and A14 and sends an AND signal S12 of the signals ADS, A15, and A14 to the first OR gate 58. The first OR gate 58 performs an OR operation on the signals S11 and S12 to generate the fourth select signal SEL3.

The third AND gate 55 receives the address signal A15 and the inverted address signal A14X and provides an AND signal S13 of the signals ADS, A15, and A14X to the second OR gate 59. The second OR gate 59 performs an OR operation on the signals S11 and S13 to generate the third select signal SEL2.

The fourth AND gate 56 receives the inverted address signal A15X and the address signal A14 and provides an AND signal S14 of the signals ADS, A15X, and A14 to the third OR gate 60. The third OR gate 60 performs an OR operation on the signals S11 and S14 to generate the second select signal SEL1.

The fifth AND gate 57 receives the inverted address signal A15X and the inverted address signal A14X and provides an AND signal S15 of the signals ADS, A15X, and A14X to the fourth OR gate 61. The fourth OR gate 61 performs an OR operation on the signals S11 and S15 to generate the first select signal SEL0.

As shown in FIG. 7, in the normal mode, the address decoder 12a decodes the upper-2-bit address signals A15 and A14 to generate the first to fourth select signals SEL0 to SEL3 in response to the H-level upper address decode signal ADS. In the test mode, the address decoder 12a generates the H-level first to fourth select signals SEL0 to SEL3 in response to the H-level upper address decode signal ADS. In response to the L-level upper address decode signal ADS, the address decoder 12a generates the L-level first to fourth select signals SEL0 to SEL3, regardless of the mode.

Figure 8:
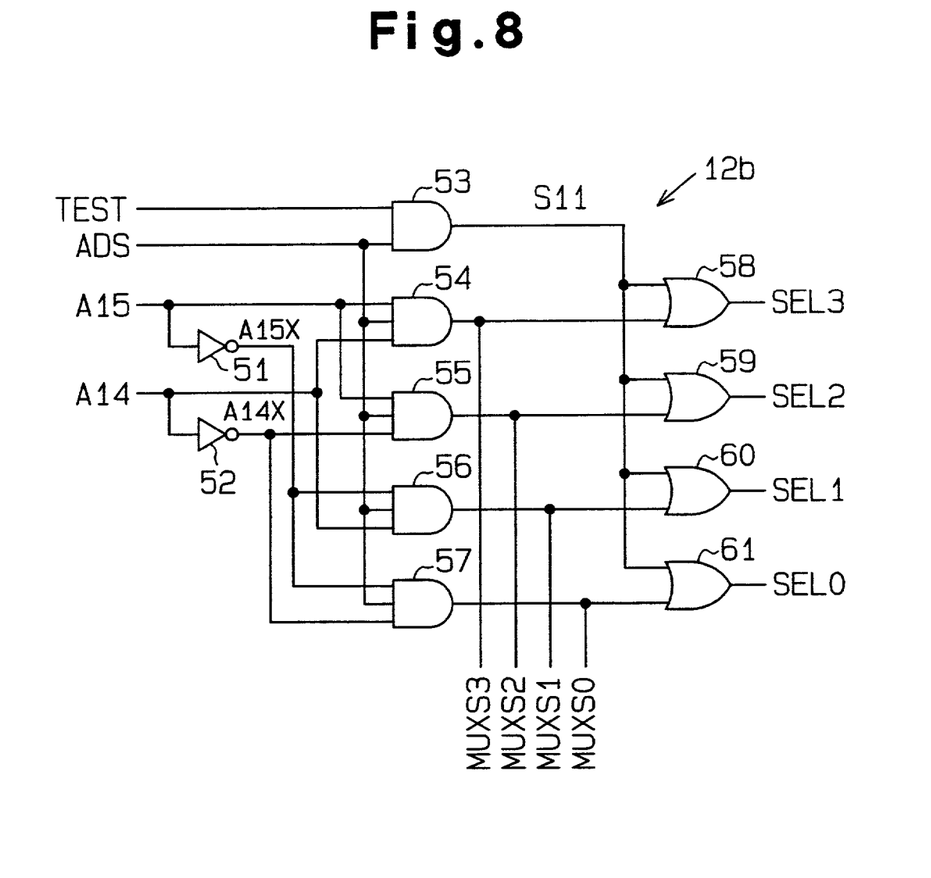
FIG. 8 is a schematic circuit diagram of an address decoder according to a second modification.
Figure 9:
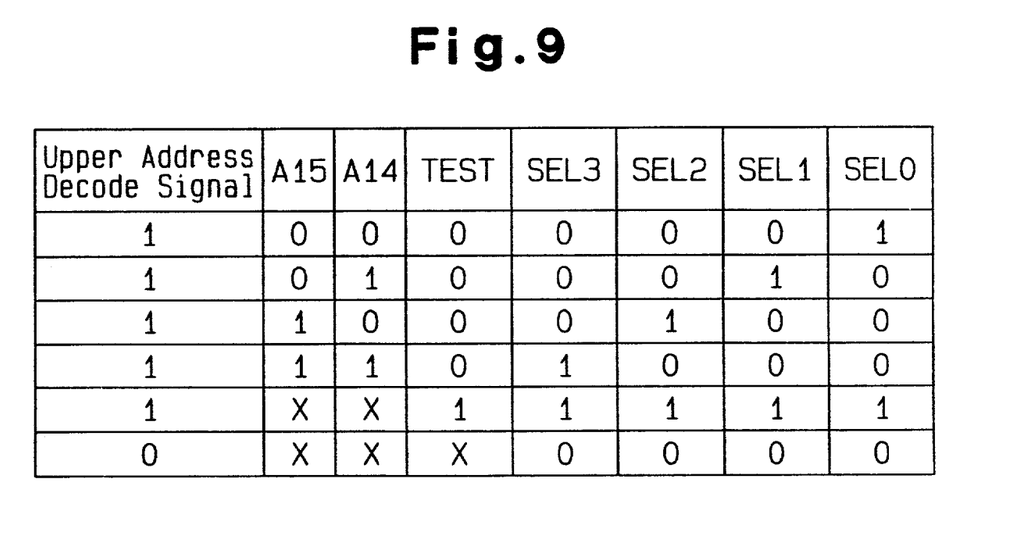
FIG. 9 is an explanatory diagram for the operation of the address decoder of FIG. 8.
Figure 10:
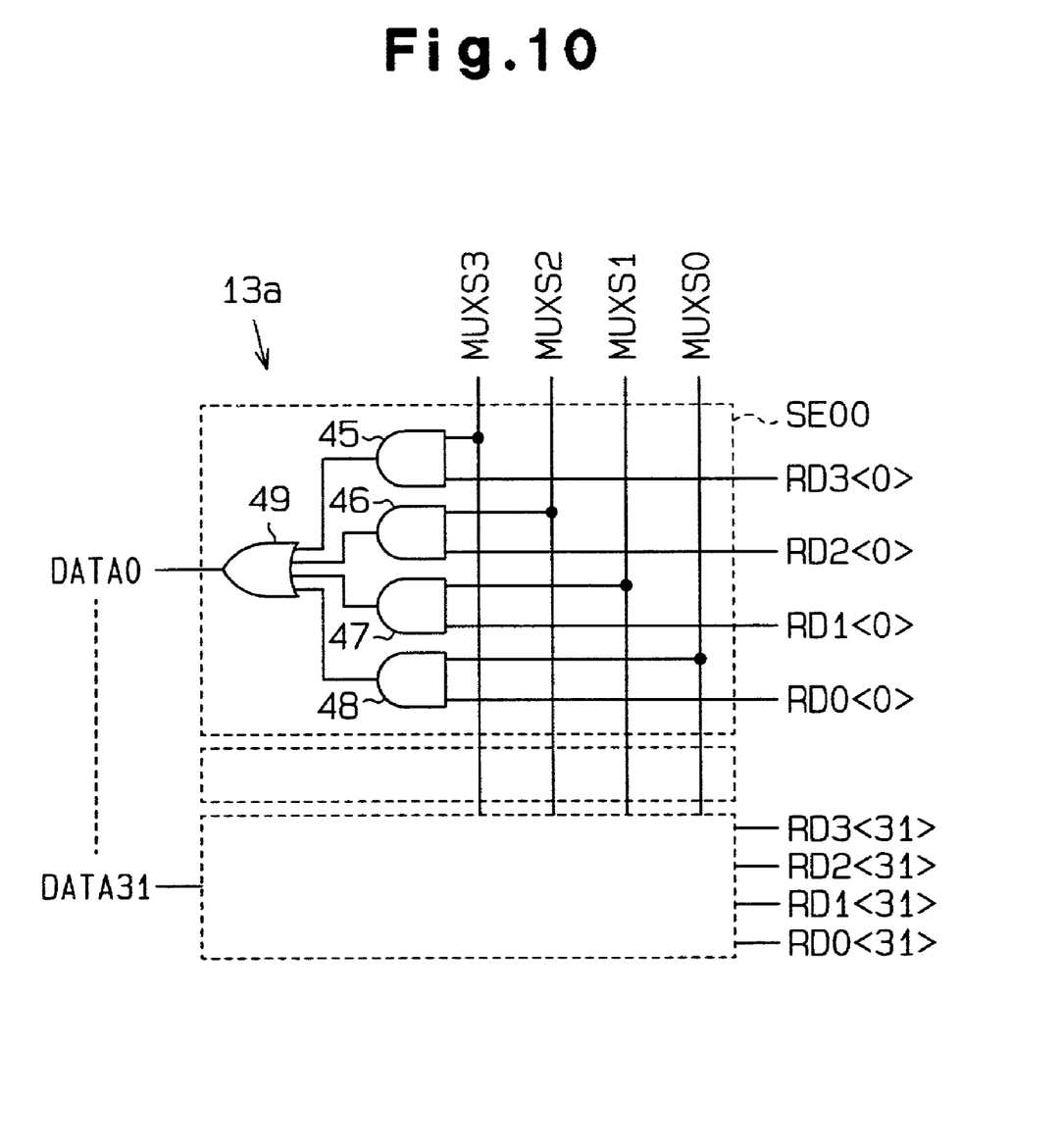
FIG. 10 is a schematic circuit diagram of a multiplexer according to a first modification.

(2) An address decoder 12b in FIG. 8 may be used in place of the address decoder 12. FIG. 9 is an explanatory diagram of the operation of the address decoder 12b. The address decoder 12b is the address decoder 12a in FIG. 6 with an additional circuitry for generating and supplying select signals to the multiplexer. The output signals of the second to fifth AND gates 54 to 57 are supplied to a multiplexer as multiplexer select signals MUXS3 to MUXS0. One of the multiplexer select signals MUXS3 to MUXS0 that corresponds to the memory circuit being accessed by the CPU 11 is made active. In FIG. 10, the multiplexer select signals MUXS3 to MUXS0 are supplied to a multiplexer 13a.

The multiplexer 13a includes plural (32 in the present embodiment) selection circuits SE00 to SE31. The first to thirty-second selection circuits SE00 to SE31 are the same as those of the multiplexer 13 in FIG. 4.

The multiplexer 13a outputs a signal having the same level as that of read data in response to an active multiplexer select signal and outputs an L-level signal in response to an inactive multiplexer select signal.

For example, when the CPU 11 accesses the second memory circuit RAM1, the second multiplexer select signal MUXS1 is made active. Therefore, the multiplexer 13a outputs signals DATA0 to DATA31 having the same level as that of the second read data RD1<31> to RD1<0> corresponding to the active second multiplexer select signal MUXS1. That is, the multiplexer 13a provides the CPU 11 with the read data that has been read from the memory circuit accessed by the CPU 11.

The CPU 11 of the semiconductor device, which includes the address decoder 12b and the multiplexer 13a, compares the read data from the selected memory circuit with the write data in the test mode and determines whether the read data match with the write data.

Figure 11:
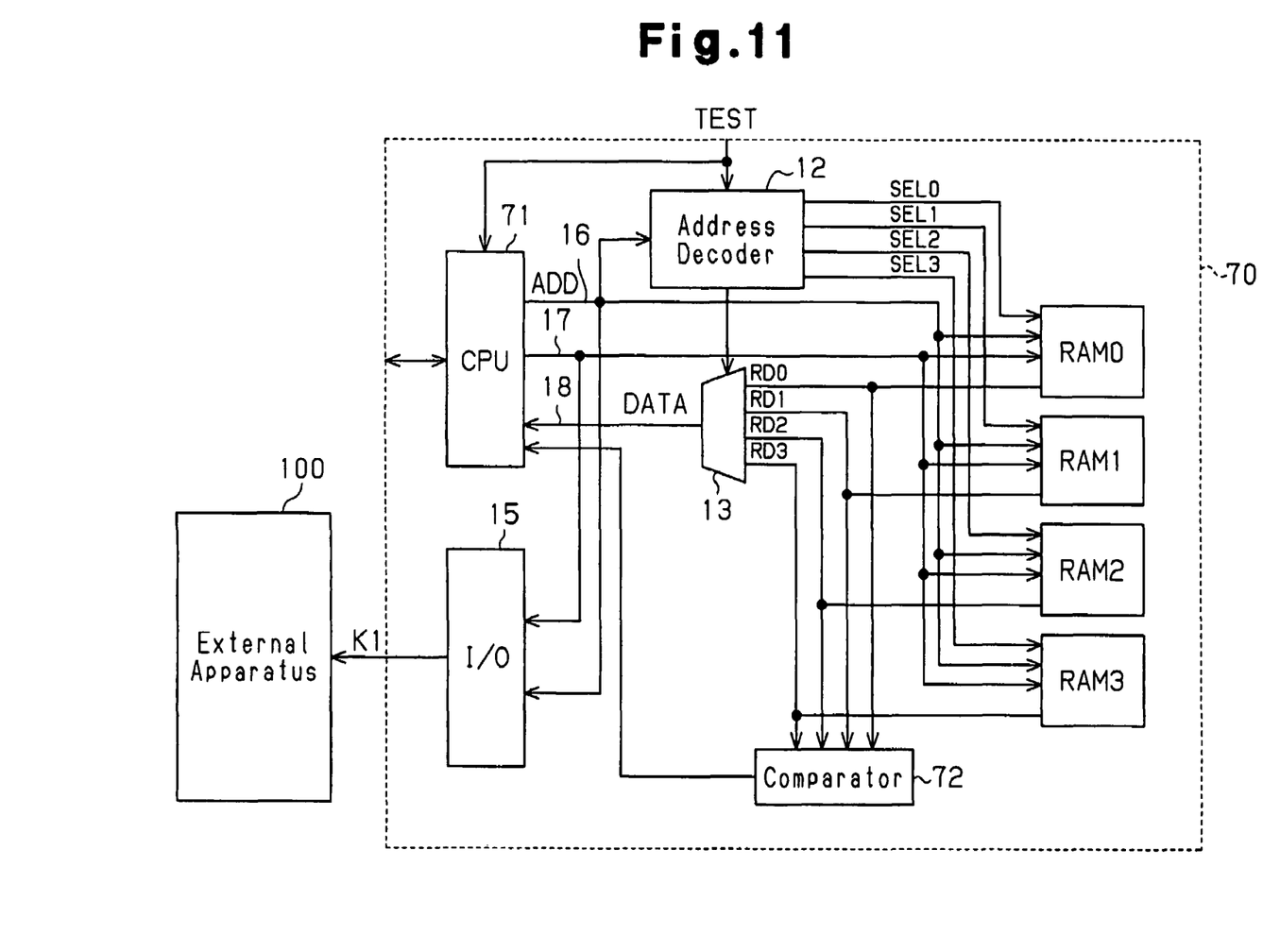
FIG. 11 is a schematic block diagram of a semiconductor device according to a second embodiment of the present invention.

(3) The present invention may be adapted by a semiconductor device 70 as shown in FIG. 11. The semiconductor device 70 includes a CPU 71, a plurality (four in the present embodiment) of memory circuits RAM0 to RAM3, an address decoder 12, a multiplexer 13, a comparator 72 and an input/output circuit 15.

The comparator 72 includes a register for storing the results of comparing all of the read data RD0 to RD3 with one another. The CPU 71 receives comparison results stored in the register of the comparator 72 and provides a signal indicating whether the first to fourth memory circuits RAM0 to RAM3 are operating normally. The signal is supplied to an external apparatus 100 via the input/output circuit 15 based on the comparison results and the results of comparing whether the read data from the memory circuits coincide with the write data. As the CPU 71 outputs the test results, the testing apparatus 100 only has to receive the test results from the semiconductor device 70. This simplifies the structure of the testing apparatus. The testing apparatus can acquire test results regardless of the operational speed of the semiconductor device 70.

The comparator 72 may have a function of generating an interruption to the CPU 71. That is, when the read data do not match with the write data, the comparator 72 requests an interruption of the CPU 71. Upon receiving the interruption request, the CPU 71 provides the external apparatus (not shown) with a signal indicating that the first to fourth memory circuits RAM0 to RAM3 have failed. In this case, since an interruption occurs when an error is detected in the read data read from the first to fourth memory circuits RAM0 to RAM3, the memory test can be interrupted. This shortens the time to test the semiconductor device having failed memory circuit(s), thereby shortening the memory testing time for multiple semiconductor devices. As a result, the production cost is reduced.

Figure 12:
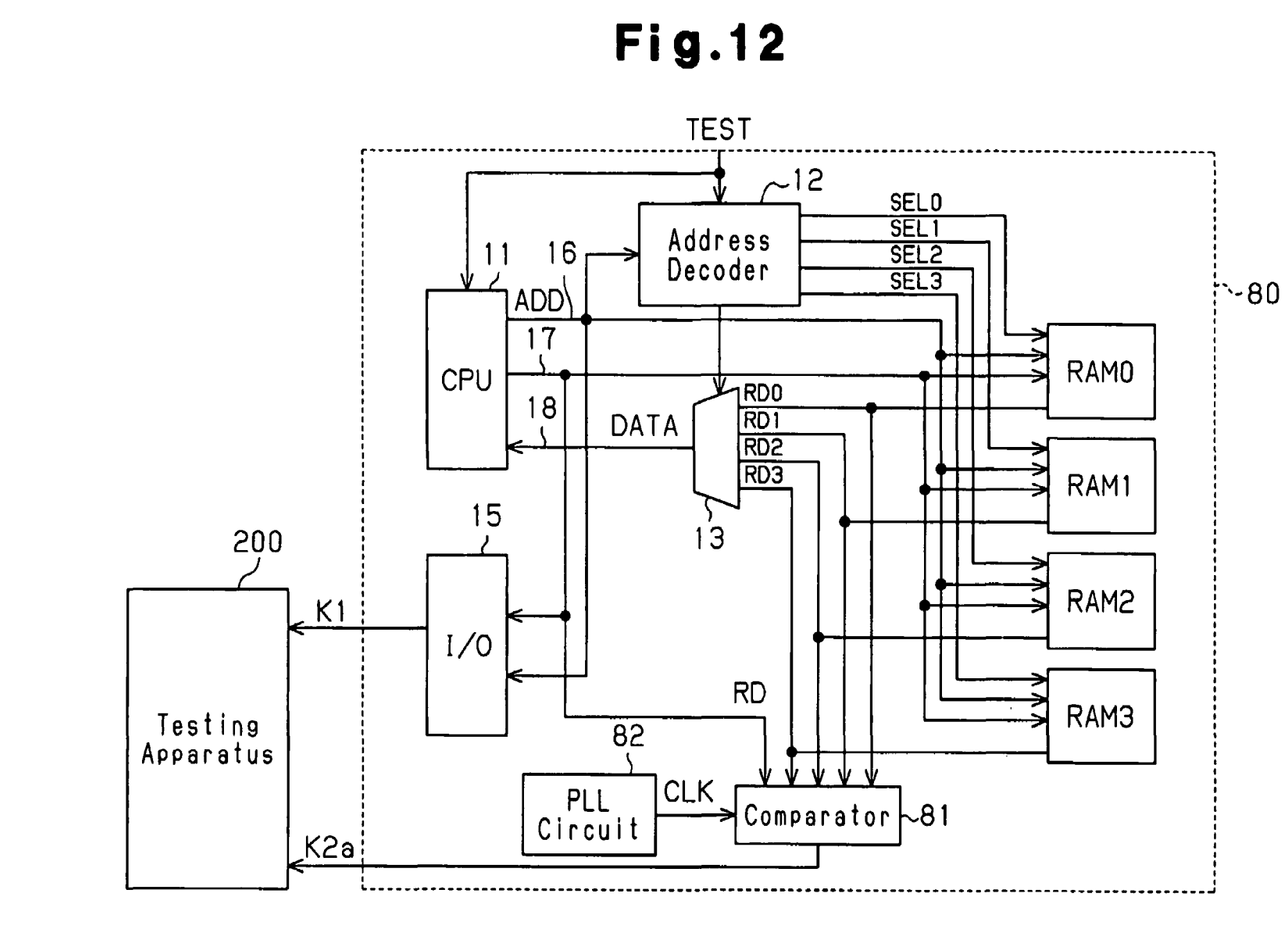
FIG. 12 is a schematic block diagram of a semiconductor device according to a third embodiment of the present invention.

(4) The present invention may be adapted by a semiconductor device 80 as shown in FIG. 12. The semiconductor device 80 includes a CPU 11, a plurality (four in the present embodiment) of memory circuits RAM0 to RAM3, an address decoder 12, a multiplexer 13, a comparator 81, an input/output circuit 15, and a PLL circuit 82.

Figure 13:
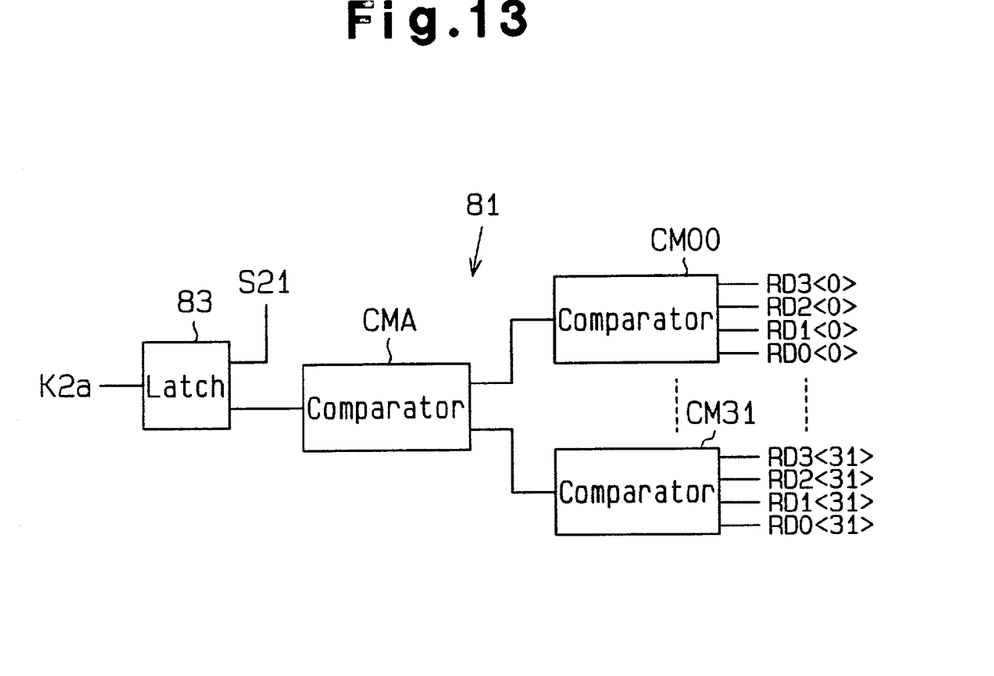
FIG. 13 is a schematic circuit diagram of a comparator of the semiconductor device of FIG. 12.

The PLL circuit 82 generates an operational clock signal CLK for the semiconductor device 80. As shown in FIG. 13, the comparator 81 includes a latch circuit 83. The latch circuit 83 is supplied with the output signal of a final-stage comparison circuit CMA and a combined signal S21. The combined signal S21 has been produced by logically combining the clock signal CLK and a read signal RD. The latch circuit 83 latches the decision result from the comparison circuit CMA every time read data is read from the memory circuits RAM0 to RAM3 in accordance with the combined signal S21. It is preferable that latched data should be reset at the beginning of a memory test, not during the memory test.

For example, the comparator 81 outputs an L-level signal as a result of the reset operation, and latches an H-level signal when the read data from the first to fourth memory circuits RAM0 to RAM3 do not coincide with one another. A decision signal K2a or the output signal of the comparator 81 is supplied to a testing apparatus 200 coupled to the semiconductor device 80, and the testing apparatus determines whether the semiconductor device 80 is defective in accordance with the decision signal K2a. In this case, since the decision signal K2a is latched by the comparator 81, even a testing apparatus, which operates according to a clock slower than the operational clock of the semiconductor device 80, can reliably receive the decision signal K2a. Even if the operational speed of the semiconductor device becomes faster, therefore, a memory test on the semiconductor device can be conducted without replacing the testing apparatus with one that matches the operational speed. This prevents the test cost from increasing. Further, the memory test can be carried out while operating the semiconductor device 80 at actual operational speed of the semiconductor device, regardless of the operational speed of the testing apparatus. This makes it possible to accurately determine whether the memory circuits RAM0 to RAM3 are failing.

With the use of a comparator that has no latch function, a testing apparatus whose clock is slower than the operational clock of the target semiconductor device may not receive the decision signal in some cases. For example, when the operational clock of the semiconductor device is 400 MHz and the operational clock of the testing apparatus is 200 MHz, the comparator compares the read data from the first to fourth memory circuits RAM0 to RAM3 with one another according to the operational clock (400 MHz) of the semiconductor device and outputs a comparison signal. In this case, the testing apparatus may fail to receive the first decision signal indicating that there is no match, even though it can receive the second decision signal, which is output following the first decision signal, indicating that there is a match. This disables the testing apparatus from determining whether the first to fourth memory circuits RAM0 to RAM3 are failing in accordance with the first decision signal.

Figure 14:
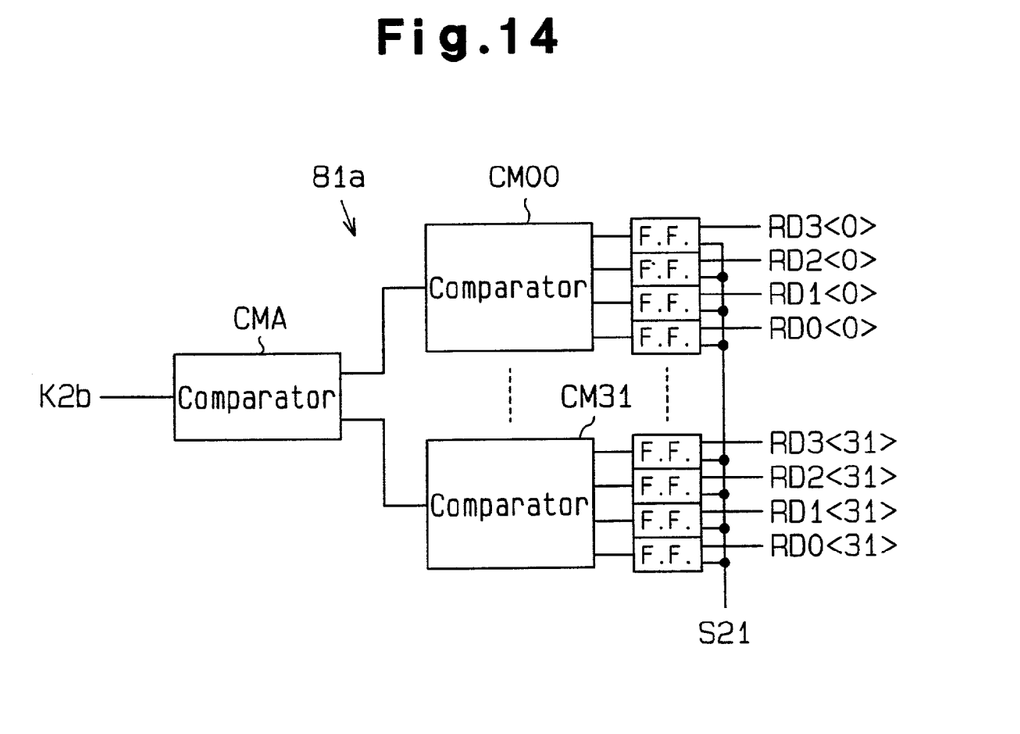
FIG. 14 is a schematic circuit diagram of a comparator according to a first modification.

(5) A comparator 81a shown in FIG. 14 may be used. In the comparator 81a, flip-flops (FF) having a latch function are coupled to the inputs of the first-stage comparison circuits CM00 to CM31. The individual flip-flops latch the read data from the first to fourth memory circuits RAM0 to RAM3 in accordance with the combined signal S21 that has been produced by logically combining the clock signal CLK and the read signal RD at the read timing of the first to fourth memory circuits RAM0 to RAM3. The comparator 81a holds the comparison results until the next read operation takes place. Even if the read cycle for the read data from the first to fourth memory circuits RAM0 to RAM3 is short, therefore, comparison of the read data can be executed reliably.

Figure 15:
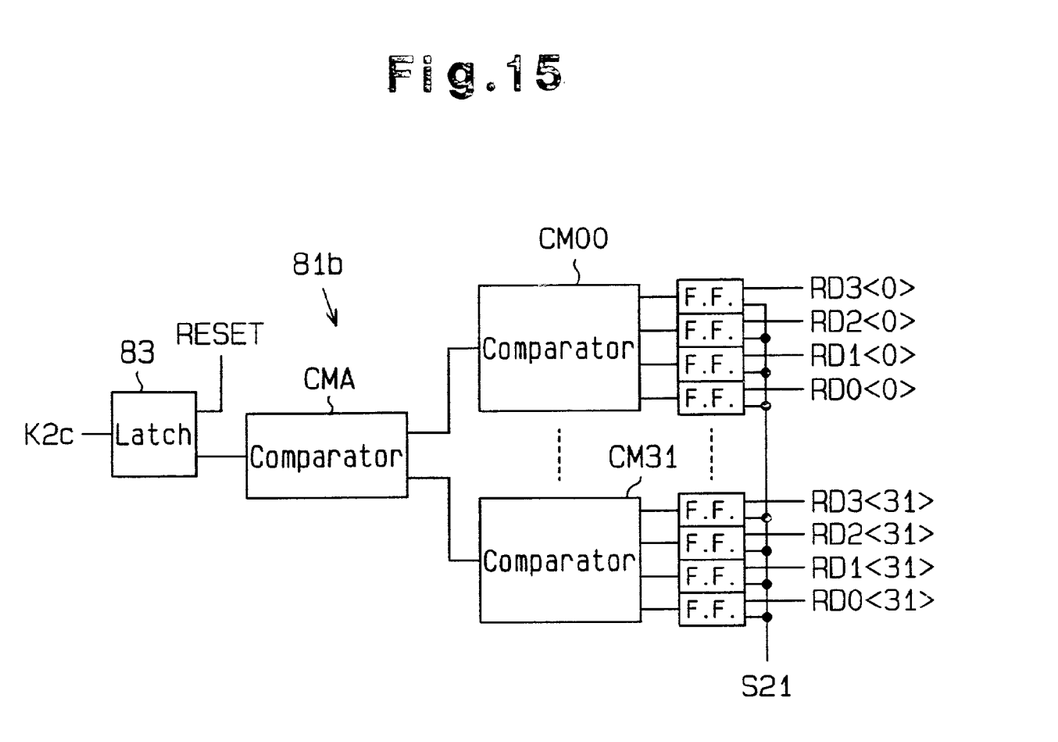
FIG. 15 is a schematic circuit diagram of a comparator according to a second modification.

(6) A comparator 81b shown in FIG. 15 may be used. In the comparator 81b, flip-flops (FF) are coupled to the inputs of the first-stage comparison circuits CM00 to CM31 and a latch circuit 83 is coupled to the output of the second-stage comparison circuit CMA. The latch circuit 83 is supplied with a reset signal RESET. In this case, the flip-flops retain the comparison time and whether the read data from the memory circuits RAM0 to RAM3 match with one another can be detected reliably based on the operational frequency of the target semiconductor device.

(7) Instead of separately providing the write-data and control bus 17 and the read-data bus 18, the write-data bus and the read-data bus may be constituted by a tri-state bidirectional bus.

Therefore, the present examples and embodiments are to be considered as illustrative and not restrictive and the invention is not to be limited to the details given herein, but may be modified within the scope and equivalence of the following claims.

What is claimed is:

1. A method of testing a plurality of memory circuits included in a semiconductor device, comprising steps of:
   selecting the plurality of memory circuits and causing the memory circuits to perform a read/write operation;
   comparing plural pieces of read data read from the plurality of memory circuits in a read operation with one another and generating a first signal as first comparison results;
   comparing one of the plural pieces of read data, which is read from a predetermined one memory circuit, with write data and generating a second signal as a second comparison result in parallel with the first signal; and
   testing the plurality of memory circuits based on the first and second signals.

2. The method according to claim 1, wherein the step of comparing one of the plural pieces of read data with the write data includes comparing a specific one of the plural pieces of read data with the write data.

3. The method according to claim 1, further comprising a step of temporarily holding the first signal.

4. The method according to claim 1, further comprising a step of temporarily holding the plural pieces of read data.

5. The method according to claim 4, further comprising a step of temporarily holding the first signal.

6. A semiconductor device comprising:
   a plurality of memory circuits each of which performs data writing and data reading;
   a processing unit coupled to the plurality of memory circuits for accessing one of the plurality of memory circuits for data writing and data reading by supplying an address signal thereto;
   an address decoder coupled to the processing unit for receiving the address signal and generating a plurality of select signals for selecting the plurality of memory circuits in a test mode, wherein the plurality of memory circuits perform data writing and data reading in accordance with the plurality of select signals;
   a multiplexer coupled to the plurality of memory circuits and the processing unit for supplying the processing unit with read data read from a predetermined one memory circuit which is accessed by the processing unit; and
   a comparator coupled to the plurality of memory circuits for comparing plural pieces of read data respectively read from the plurality of memory circuits with one another in the test mode and generating a first signal as first comparison results, wherein in the test mode, the processing unit compares data written in the plurality of memory circuits with one of the plural pieces of read data read from the predetermined one memory circuit and supplied from the multiplexer and generates a second signal as a second comparison result to test the plurality of memory circuits based on the first and second signals, wherein the comparator generates the second signal in parallel with the first signal.

7. The semiconductor device according to claim 6, wherein the address decoder generates the plurality of select signals based on an address signal for the predetermined memory circuit and wherein the multiplexer receives the plurality of select signals from the address decoder and supplies data read from the predetermined memory circuit to the processing unit based on the plurality of select signals in the test mode.

8. The semiconductor device according to claim 6, wherein the address decoder decodes the address signal to generate a decode signal and wherein the multiplexer receives the decode signal from the address decoder and supplies data read from the predetermined memory circuit to the processing unit in accordance with the decode signal.

9. The semiconductor device according to claim 6, wherein the comparator temporarily holds the first signal.

10. The semiconductor device according to claim 6, wherein the comparator supplies an interruption signal to the processing unit when the plural pieces of read data do not coincide with one another.

11. The semiconductor device according to claim 6, wherein the comparator includes a memory circuit for temporarily holding the first signal.

12. The semiconductor device according to claim 6, wherein the comparator includes a first memory circuit for temporarily holding the plural pieces of read data.

13. The semiconductor device according to claim 12, wherein the comparator includes a second memory circuit for temporarily holding the first signal.

14. A system for testing a plurality of memory circuits included in a semiconductor device, comprising:
- an address decoder for selecting the plurality of memory circuits and causing the memory circuits to perform a read/write operation;
- a comparator for receiving plural pieces of read data read from the plurality of memory circuits and comparing the plural pieces of read data with one another to generate a first signal as first comparison results; and
- a processing unit for comparing one of the plural pieces of read data, which is read from a predetermined memory circuit, with write data and generating a second signal as a second comparison result to test the plurality of memory circuits based on the first and second signals, wherein the processing unit generates the second signal in parallel with the first signal.

15. The system according to claim 14, further comprising a multiplexer for receiving the plural pieces of read data and supplying a specific one of the plural pieces of read data read from the predetermined memory circuit to the processing unit.

16. The system according to claim 14, wherein the comparator includes a memory circuit for temporarily holding the first signal.

17. The system according to claim 14, wherein the comparator includes a first memory circuit for temporarily holding the plural pieces of read data.

18. The system according to claim 17, wherein the comparator includes a second memory circuit for temporarily holding the first signal.

* * * * *